(12) United States Patent
Roohparvar

(10) Patent No.: US 7,676,710 B2
(45) Date of Patent: Mar. 9, 2010

(54) ERROR DETECTION, DOCUMENTATION, AND CORRECTION IN A FLASH MEMORY DEVICE

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 877 days.

(21) Appl. No.: 11/444,705

(22) Filed: Jun. 1, 2006

(65) Prior Publication Data

US 2006/0236207 A1 Oct. 19, 2006

Related U.S. Application Data

(62) Division of application No. 10/431,889, filed on May 8, 2003, now Pat. No. 7,203,874.

(51) Int. Cl.
*G11C 29/00* (2006.01)
(52) U.S. Cl. .................. 714/723; 714/711
(58) Field of Classification Search .......... 714/710, 714/711, 718, 719, 721, 723; 365/201
See application file for complete search history.

(56) References Cited

U.S. PATENT DOCUMENTS 5,771,346 A * 6/1998 Norman et al. ............ 714/42
6,442,724 B1 * 8/2002 Augarten ................... 714/738
6,469,932 B2 * 10/2002 Roohparvar et al. ... 365/185.09
6,614,689 B2    9/2003 Roohparvar
6,614,690 B2    9/2003 Roohparvar
6,643,196 B2 * 11/2003 Sugio ....................... 365/200
6,795,942 B1 *  9/2004 Schwarz .................... 714/718

OTHER PUBLICATIONS

Bhavsar, "An Algorithm for row-column self-repair of RAMS and its implementation in the alpha 21264" Sep. 1999, International test conference 1999, pp. 311-318.*
Day, John, R.: "A Fault-Driven, Comprehensive Redundancy Algorithm," IEEE Design & Test of Computers, US, IEEE Computers Society, Los Alamitos, vol. 2, No. 3, Jun. 1, 1985, pp. 35-44, XP000744056.*

* cited by examiner

*Primary Examiner*—Cynthia Britt
(74) *Attorney, Agent, or Firm*—Leffert Jay & Polglaze, P.A.

(57) ABSTRACT

A memory device has an error documentation memory array that is separate from the primary memory array. The error documentation memory array stores data relating to over-programmed bits in the primary array. When the over-programmed bits in the primary array are erased, the error documentation memory array is erased as well, deleting the documentation data relating to the over-programmed bits.

22 Claims, 4 Drawing Sheets

ERROR DETECTION, DOCUMENTATION, AND CORRECTION IN A FLASH MEMORY DEVICE

RELATED APPLICATION

This Application is a Divisional of U.S. application Ser. No. 10/431,889, titled "ERROR DETECTION, DOCUMENTATION, AND CORRECTION IN A FLASH MEMORY DEVICE," filed May 8, 2003, now U.S. Pat. No. 7,203,874 which is commonly assigned and incorporated herein by reference.

TECHNICAL FIELD OF THE INVENTION

The present invention relates generally to memory devices and in particular the present invention relates to error correction in memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices. Most electronic devices are designed with a single flash memory device.

Typical flash memory uses a single bit per cell. Each cell is characterized by a specific threshold voltage or $V_t$ level. Electrical charge is stored on the floating gate of each cell. Within each cell, two possible voltage levels exist. These two levels are controlled by the amount of charge that is programmed or stored on the floating gate; if the amount of charge on the floating gate is above a certain reference level, the cell is considered to be in a different state (e.g., programmed, erased).

Multilevel cells have recently been introduced to greatly increase the density of a flash memory device. This technology enables storage of multiple bits per memory cell by charging the floating gate of the transistor to different levels and having multiple thresholds. This technology takes advantage of the analog nature of a traditional flash cell by assigning a bit pattern to a specific voltage range. The quantity of voltage ranges stored on the cell determines the quantity of bits that can be stored on the cell.

With the introduction of multilevel cells, the precision at which the voltages on the device are sensed greatly increases. This increases the chance for a cell to be over-programmed, from which there is no recovery. This is due to the flash device being programmed on a bit basis where the entire block is erased at the same time. To correct a mistake, there would be a requirement to erase the entire block and reprogram the entire block with the old data. Since that data does not exist anywhere except the flash, it makes it very difficult to perform a corrective action to over-programming, thus making the memory device worthless.

Various error correction schemes are typically used to solve such problems. These schemes require additional array bits to store the additional information required for the error correction code. If a memory device is a byte-wide device, four additional bits per byte are required. If the memory device is a sixteen bit wide device, five additional bits are required. This additional error correction memory increases the per bit cost of the device in a technology that is already experiencing low profit margins.

For the reasons stated above, and for other reasons stated below which will become apparent to those skilled in the art upon reading and understanding the present specification, there is a need in the art for an improved error correction scheme in a memory device.

BRIEF DESCRIPTION OF THE DRAWINGS

FIG. 6 shows a flowchart of one embodiment of a read operation of the present invention.

DETAILED DESCRIPTION

Figure 1:
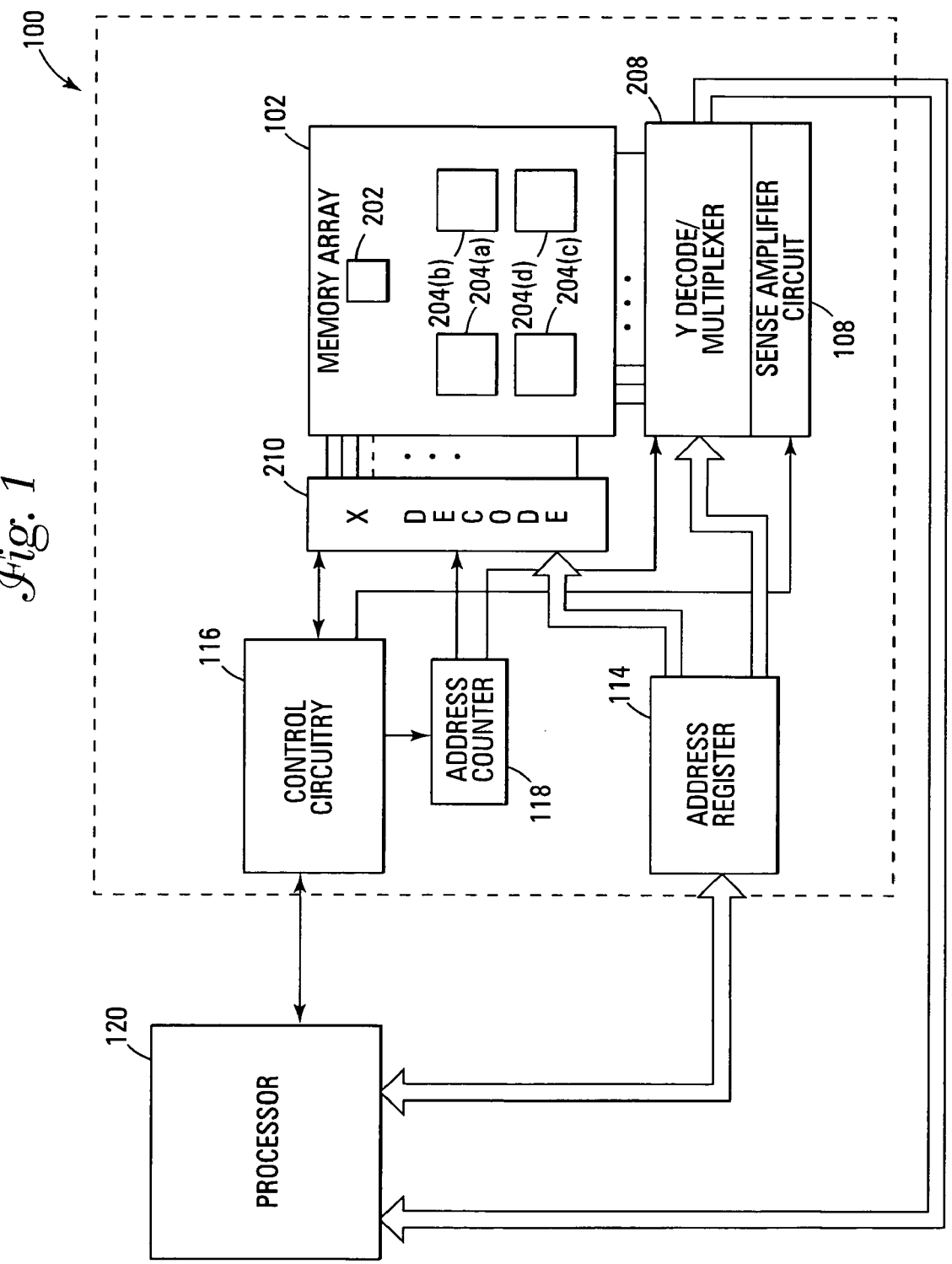
FIG. 1 shows a block diagram of one embodiment of a memory system of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified block diagram of an electronic system incorporating one embodiment of a flash memory 100 of the present invention having an error documentation memory array. As shown, the flash memory 100 has controller circuitry 116 to control memory operations to a memory array 102. These memory operations may include reading, programming, erasing, and executing the methods of the present invention. In one embodiment, the control circuitry 116 is a microsequencer 116.

The controller circuitry 116 may go through a series of steps that select a word line in the memory array, apply a controlled voltage for a given duration of time, clean the residual voltages off the bit lines, verify whether the cell has been programmed to a satisfactory level, and repeat those steps until the desired operation is complete. The controller circuitry 116 can also perform other tasks depending on the embodiment.

The flash memory is also shown having an address register 114, an address counter 118, an X decode circuit 210, a Y decode circuit/multiplexer circuit 208 and a sense amplifier circuit 108. The X decode circuit 210 decodes address requests to rows of memory cells in the memory array 102. Although not shown, the X decode circuit 210 may include a multiplexer circuit to combine two or more signals. The Y decode/multiplexer circuit 208 decodes and multiplexes address requests to columns of memory cells in the memory array 102. The sense amplifier circuit 108 reads addressed or accessed memory cells in the memory array 102.

The memory array 102 has four array blocks 204(a-d) of memory cells that may be referred to as the primary array 204(a-d). The memory array 102 is also shown as having an "error documentation memory array" 202. The error documentation memory array is coupled to the memory array 102 so as to use the same peripheral circuitry as the array blocks 204(a-d). The error documentation memory array 202 stores the documentation data of the present invention. The memory array 102 is discussed subsequently in greater detail with reference to FIG. 2.

Although, FIG. 1 is illustrated as having a primary array with four erasable array blocks 204(a-c) of memory, it is understood in the art that the present invention is not limited to any certain quantity of erasable blocks.

An external processor 120 is coupled to the control circuitry 116 to provide external commands to the flash memory 100. The processor 120 is also coupled to the address register 114 to provide address requests. The processor 120 of the system of the present invention is any microprocessor, microcontroller, or other type of control circuitry.

The flash memory device illustrated in FIG. 1 has been simplified to facilitate a basic understanding of the features of the memory of the present invention. A more detailed understanding of internal circuitry and functions of flash memories are known to those skilled in the art.

Figure 2:
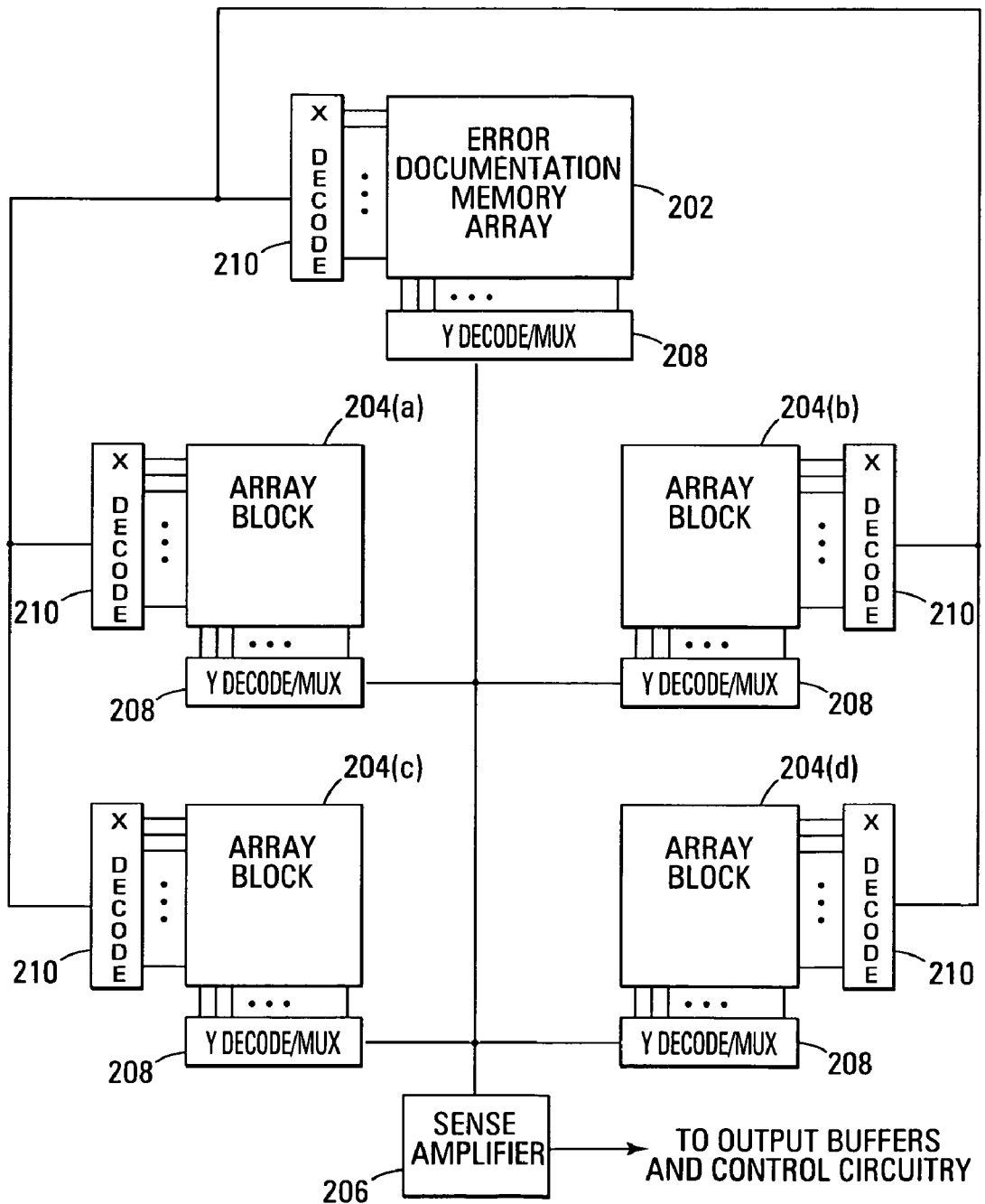
FIG. 2 shows a block diagram of one embodiment of the memory array incorporating the scratch control memory array of the present invention.

FIG. 2 illustrates a block diagram of one embodiment of the memory array 102 incorporating the error documentation memory array 202 and support circuitry 208 and 210 of the present invention. The array blocks 204(a-d) are coupled to the X decode 210 and the Y decode/multiplexer 208. The error documentation memory array 202 is also coupled to the X decode 210 and the Y decode/multiplexer 208. This limits the amount of added elements needed to store and implement the operating parameters.

The sense amplifier 206 reads the state of the addressed cells in the array blocks 204(a-d) as well as the memory cells of the error documentation memory array 202. As illustrated in FIG. 2, an output of sense amplifier 206 is selectively coupled to the output buffers of the memory device as is well know in the art. The output of the sense amplifier 206 is also coupled to the microsequencer or other control circuit so that the instructions stored in the error documentation memory array 202 can be accessed and executed.

An advantage of using a sense amplifier 206, as described, is that it creates a very reliable system. In addition, since the error documentation memory array 202 is coupled as a normal memory block, the memory is able to use an internal algorithm of the control circuitry 116 to verify if an operating parameter was successfully written to an associated local latch.

Figure 3:
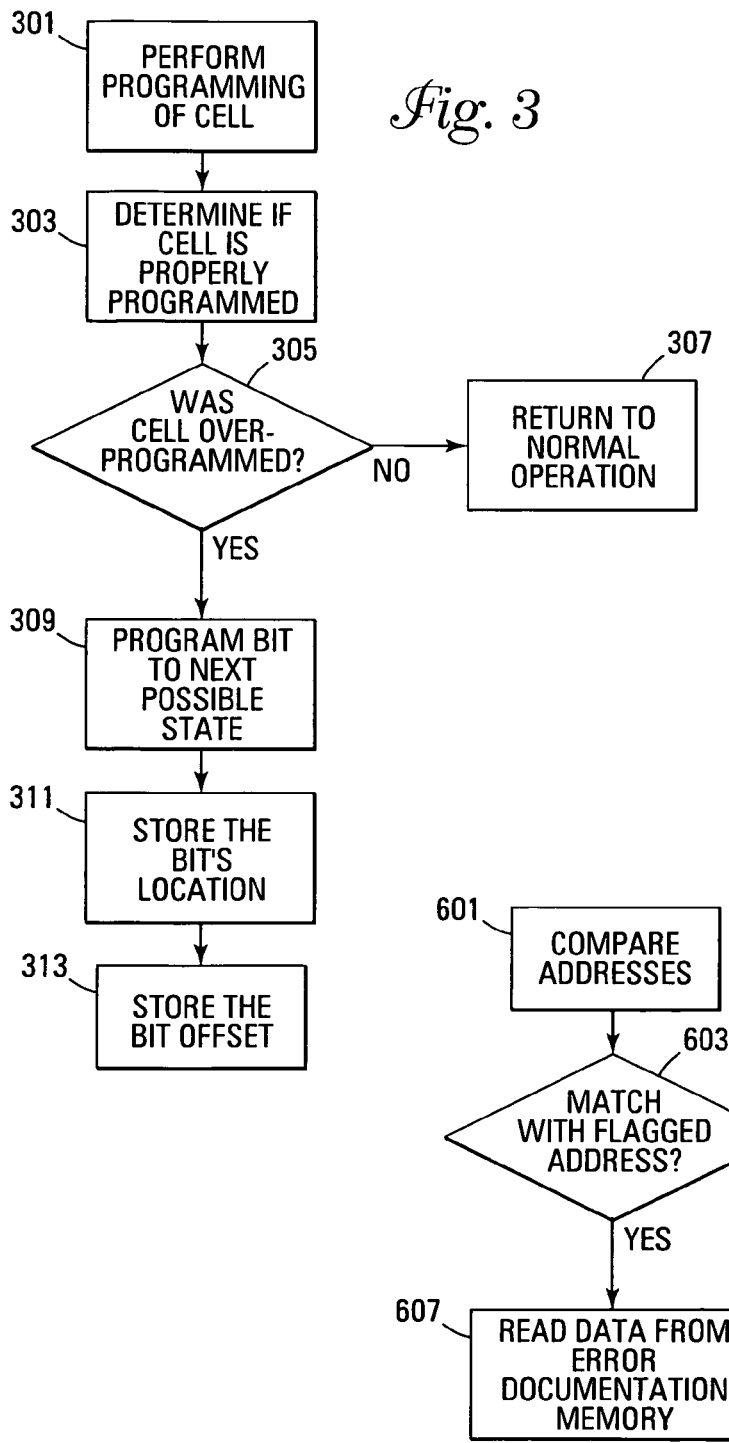
FIG. 3 shows a flowchart of one embodiment of the error detection, documentation, and correction method of the present invention.
Figure 4:
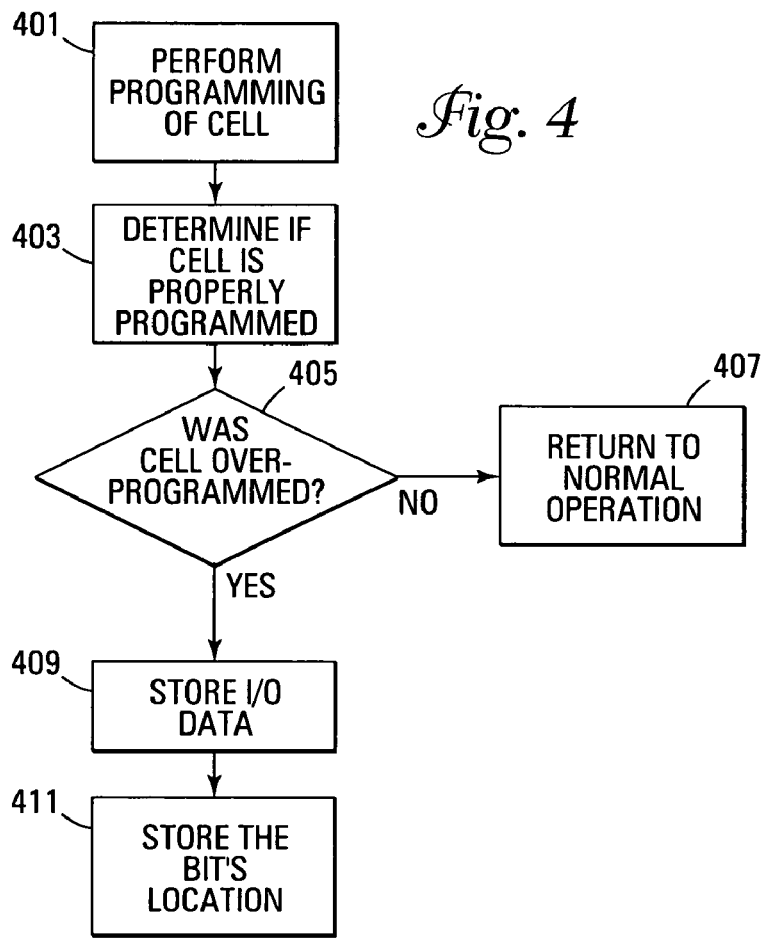
FIG. 4 shows a flowchart for another embodiment of the error detection, documentation, and correction method of the present invention.

FIGS. 3 and 4 illustrate flowcharts of two embodiments of the error detection, documentation, and correction method of the present invention. FIG. 3 would best be used in a multi-level cell memory device that has not been over-programmed beyond the capability of the cell. The embodiment of FIG. 4 would best be used in a multilevel cell memory device that has been over-programmed beyond the last voltage range possible for the cell or for a cell that stores only a single bit.

The methods of the present invention use the error documentation memory array, illustrated in FIG. 2, to document the location of an over-programmed bit in the memory array. The current I/O data or an offset of the current I/O data, depending on the embodiment, is also stored in this memory array.

Referring to FIG. 3, the method performs a normal cell programming operation 301 in order to store data on the cell. This operation is to store multiple bits on the cell. The present invention is not limited to any one quantity of programmed bits.

It is then determined if the cell was properly programmed 303. If the cell was not over-programmed 305, the method proceeds normally 307 to whatever operation was being performed. The method for determining proper programming of a cell is well known in the art and is not discussed further.

If the cell was over-programmed 305, the cell is programmed to the next possible state. This is accomplished by increasing the voltage on the cell until it is within the voltage range of the next bit state. For the situation where the cell has been programmed beyond all of the voltage ranges possible for the cell, the embodiment of FIG. 4 is used, as discussed subsequently.

The address of the over-programmed bit is stored in the error documentation memory array 311. This address is used when that particular address is accessed during a read operation, as discussed subsequently with reference to FIG. 6. The bit's offset is also stored 313 in the error documentation memory array in such a way that it will be read with the address.

The bit offset is an indicator of the difference between what is actually programmed in the cell and what the I/O data was supposed to be. For example, if a "01" was to be programmed in the cell and that voltage range was over-programmed, the cell will be programmed with a voltage that puts it into the next voltage range for I/O data bits "10". In one embodiment, this makes the offset indicator a 1 to indicate the next voltage range. If the cell was over-programmed by two voltage ranges such that the I/O data bits are actually programmed as a "11", the offset indicator is a 2.

FIG. 4 illustrates a second embodiment of the error detection, documentation, and correction method of the present invention. This embodiment is typically used when a multi-level cell has been over-programmed beyond its highest voltage range or is a single bit cell that has been over-programmed.

The method of FIG. 4 performs a normal cell programming operation 401 in order to store data on the cell. The cell is checked for proper programming 403. If the cell was not over-programmed 405, the method proceeds normally 407 to whatever operation was being performed. The method for determining proper programming of a cell is well known in the art and is not discussed further.

If the cell was over-programmed 405, the I/O data for that cell is stored in the error documentation memory array 409. In an alternate embodiment, an indication of the redundant column that has the I/O data for that cell is stored.

The address of the over-programmed bit is stored in the error documentation memory array 411. This address is used when that particular address is accessed during a read operation, as discussed subsequently with reference to FIG. 6.

Figure 5:
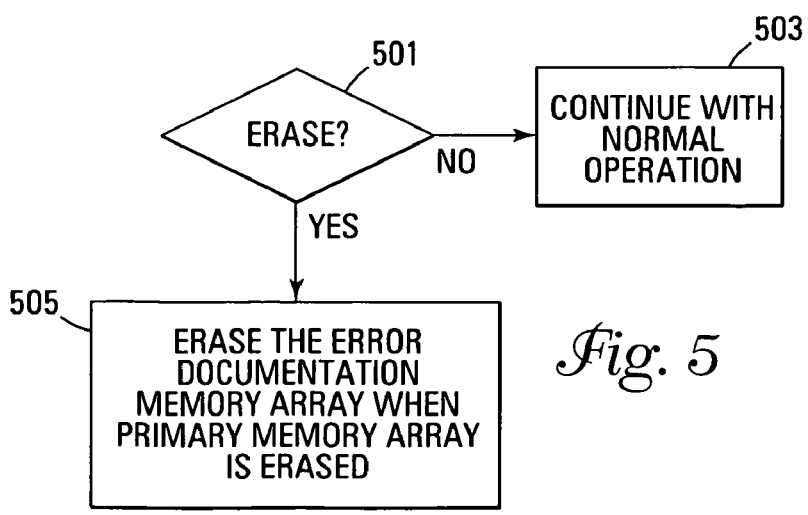
FIG. 5 shows a flowchart for one embodiment of an erase operation of the present invention.

FIG. 5 illustrates a flowchart of one embodiment for an erase method of the present invention. This method enables the memory device to dynamically allocate the error documentation memory array whenever the primary memory array is erased.

For example, a cell may indicate an over-programmed state for one or more program cycles. Then the cell may become programmable again. The prior art error correction schemes would have labeled this cell as bad and used the redundant rows and columns to permanently replace the bad cell.

The methods of the present invention do not permanently label cells as over-programmed since the error documentation memory array is erased, eliminating any indication of previously over-programmed cells. Thus, if a cell was indicated as over-programmed in the error documentation memory array during one cycle but then is programmable during a subsequent program cycle, the over-program indication is no longer needed for that cell.

Referring to FIG. 5, if an erase indication is not received 501, the normal operation of the memory device is continued 503. When an erase indication is received 501, the error documentation memory array is erased when the primary memory array is erased 505.

FIG. 6 illustrates one embodiment of a read method of the present invention. This method uses the indications stored in the error documentation memory array to determine when to access the primary array for I/O data and when to access the error documentation array or redundant columns/rows.

The method compares address 601 of incoming read operations. If the incoming address does not match any of the addresses flagged as over-programmed 603, a normal read operation is executed 605.

If the incoming address matches an address flagged as over-programmed 603, the data for that address is read from the error documentation memory array 607. This data, depending on the embodiment as discussed above, indicates to the controller circuit where to go for the actual I/O data, the data offset, and/or the redundant column to use.

The read method of FIG. 6 may be accomplished by an extra circuit that compares incoming addresses with either a list of known bad addresses or with all of the addresses stored in the error documentation memory array. In an alternate embodiment, the control circuit of the present invention performs the comparisons.

CONCLUSION

The embodiments of the present invention enable a memory device to dynamically detect, document, and correct over-programmed cells. The indication of the over-programmed cell is stored in a separate mini-array of non-volatile memory for access by a controller or other circuit. The over-program indication can be erased when the primary memory array is erased, thus permitting the previously over-programmed cell an opportunity to self-correct and be used again.

The memory device and methods of the present invention provide a reduced overhead requirement for error correction bits, thus reducing the cost of the memory device. Assuming a 64 MB memory (22 address lines), four bits for I/O data location, and two bit field for worst case over-programming by four states. Thus, 28 bits are typically needed for each cell that has gone bad. Through statistical analysis, a determination could be made that the reliability of the memory is improved by orders of magnitude using four to six of these 28 bit fields for failure documentation after the device has left the factory. Prior art error correcting codes require millions of extra bits while the present invention typically needs less than 200 extra bits.

The embodiments of the present invention are not limited to any one type of memory technology. For example, the scratch control memory array may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for reading a flash memory device having a primary non-volatile memory array, the method comprising:
   comparing memory addresses, input to the device, with a first memory address associated with an over-programmed memory cell of the primary non-volatile memory array;
   when an input memory address matches the first memory address, reading documentation data regarding the over-programmed memory cell from a location in an error documentation memory array; and
   reading I/O data in response to the documentation data.

2. The method of claim 1 wherein the I/O data is read from a redundant column area of the primary non-volatile memory array in response to the documentation data.

3. The method of claim 1 wherein the I/O data is read from the error documentation memory array in response to the documentation data.

4. The method of claim 1 wherein reading the I/O data further comprises:
   reading data from the over-programmed memory cell; and
   adjusting the read data to generate the I/O data in response to an offset associated with the documentation data.

5. The method of claim 1 and further including erasing both the error documentation memory array and at least a portion of the primary non-volatile memory array comprising the over-programmed memory cell.

6. The method of claim 1 wherein the primary non-volatile memory array is a NAND-type memory array.

7. The method of claim 1 wherein the primary non-volatile memory array is a NOR-type memory array.

8. The method of claim 1 wherein the error documentation memory array is a mini array separate from the primary non-volatile memory array.

9. A method for reading a memory device having a primary non-volatile memory array and a separate error documentation memory array, the method comprising:
   receiving a plurality of memory addresses;
   comparing the plurality of memory addresses with a first memory address associated with an over-programmed memory cell of the primary non-volatile memory array;
   when an input memory address matches the first memory address, reading documentation data from a location in the error documentation memory array; and
   reading I/O data in response to the documentation data.

10. The method of claim 9 wherein the memory device is a NAND flash memory device.

11. The method of claim 9 wherein if a received address of the plurality of received memory addresses does not match the first memory address, performing a read operation at the received address.

12. The method of claim 9 wherein the documentation data comprises an address of where to read the I/O data.

13. The method of claim 9 wherein a control circuit of the memory device accesses the documentation data.

14. The method of claim 9 wherein the documentation data is in a range of four to six bits of data.

15. The method of claim 9 wherein the non-volatile memory array is comprised of multilevel cells.

16. A method for reading a memory device having a primary non-volatile memory array and a separate error documentation memory array, the method comprising:
   when a received memory address matches a an over-programmed cell memory address, accessing documentation data regarding the over-programmed memory cell from a location in the error documentation memory array; and
   reading I/O data in response to the documentation data.

17. The method of claim 16 wherein the I/O data is read from a redundant column area of the primary non-volatile memory array that is indicated by the documentation data.

18. The method of claim 16 wherein reading the I/O data further comprises:
   reading data from the over-programmed memory cell; and
   adjusting the read data to generate the I/O data in response to a state offset stored as the documentation data.

19. The method of claim 16 and further including:
   erasing a memory block, comprising the over-programmed memory cell, of the primary non-volatile memory array; and
   erasing portions of the error documentation array associated with the over-programmed memory cell.

20. The method of claim 16 wherein the location in the error documentation memory array comprises data indicating a location of a redundant column at which the I/O data is stored.

21. A method for reading a NAND flash memory device, the method comprising:
   determining when a received memory address matches a memory address of an over-programmed multiple bit cell;
   accessing a data offset regarding the over-programmed multiple-bit memory cell; and
   adjusting read multiple bit data in response to the data offset.

22. A method for reading a non-volatile memory device, the method comprising:
   reading multiple bit data of a bit state in response to a received memory address; and
   if the received memory address is an over-programmed memory address, adjusting the bit state in response to a state offset.

* * * * *

UNITED STATES PATENT AND TRADEMARK OFFICE
CERTIFICATE OF CORRECTION

PATENT NO. : 7,676,710 B2  Page 1 of 1
APPLICATION NO. : 11/444705
DATED : March 9, 2010
INVENTOR(S) : Frankie F. Roohparvar et al.

It is certified that error appears in the above-identified patent and that said Letters Patent is hereby corrected as shown below:

In column 7, line 6, in Claim 16, after "matches" delete "a an" and insert -- an --, therefor.

Signed and Sealed this

Twenty-fifth Day of May, 2010

David J. Kappos
*Director of the United States Patent and Trademark Office*